United States Patent
Soda

(10) Patent No.: US 8,976,282 B2
(45) Date of Patent: Mar. 10, 2015

(54) SOLID-STATE IMAGE SENSOR, METHOD OF MANUFACTURING THE SAME AND CAMERA

(71) Applicant: Canon Kabushiki Kaisha, Tokyo (JP)

(72) Inventor: Takehiko Soda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/064,453

(22) Filed: Oct. 28, 2013

(65) Prior Publication Data

US 2014/0132812 A1    May 15, 2014

(30) Foreign Application Priority Data

Nov. 12, 2012  (JP) ................................. 2012-248709

(51) Int. Cl.
*H04N 3/14* (2006.01)
*H01L 31/18* (2006.01)
*H01L 27/146* (2006.01)

(52) U.S. Cl.
CPC .......... *H01L 31/18* (2013.01); *H01L 27/14629* (2013.01); *H01L 27/1464* (2013.01); *H01L 27/14685* (2013.01); *H01L 27/14621* (2013.01); *H01L 27/14627* (2013.01)
USPC ........................................................ 348/302

(58) Field of Classification Search
USPC .............................. 348/302; 257/432; 438/72
See application file for complete search history.

(56) References Cited

U.S. PATENT DOCUMENTS

| | | | |
|---|---|---|---|
| 2006/0192883 A1* | 8/2006 | Katsuno et al. ................ | 348/340 |
| 2008/0272419 A1* | 11/2008 | Furukawa et al. ............. | 257/292 |
| 2009/0230490 A1* | 9/2009 | Yokozawa ..................... | 257/432 |
| 2010/0053400 A1* | 3/2010 | Ikeda et al. .................... | 348/308 |
| 2011/0260221 A1* | 10/2011 | Mao et al. ...................... | 257/291 |
| 2011/0266421 A1* | 11/2011 | Nozaki et al. ................. | 250/216 |
| 2013/0026592 A1* | 1/2013 | Lapadatu et al. ............. | 257/432 |

FOREIGN PATENT DOCUMENTS

JP    2011-151420 A    8/2011

OTHER PUBLICATIONS

Takehiko Soda, U.S. Appl. No. 14/046,491, filed Oct. 4, 2013.

* cited by examiner

*Primary Examiner* — James Hannett
(74) *Attorney, Agent, or Firm* — Fitzpatrick, Cella, Harper & Scinto

(57) ABSTRACT

An image sensor includes a semiconductor layer having first and second faces, and a wiring structure arranged on a side of the first face, wherein photoelectric converters are arranged in the semiconductor layer and light is incident on the second face. The wiring structure includes reflection portions having reflection regions and arranged for at least some of the photoelectric converters, absorbing portions arranged around the reflection regions, an insulator portion arranged to surround the absorbing portions, and an interlayer insulating film arranged between the first face and a group of the reflection portions, the light absorbing portions, and the insulator portion, and a reflectance of the light absorbing portions is smaller than a reflectance of the reflection regions, and a light transmittance of the light absorbing portions is smaller than a light transmittance of the insulator portion.

11 Claims, 11 Drawing Sheets

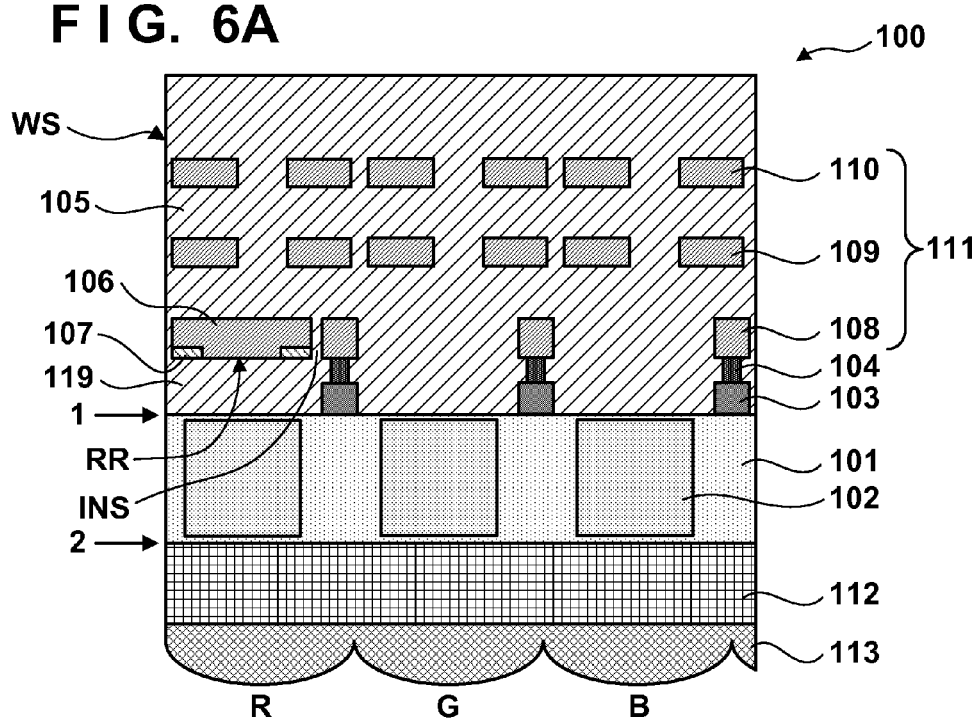
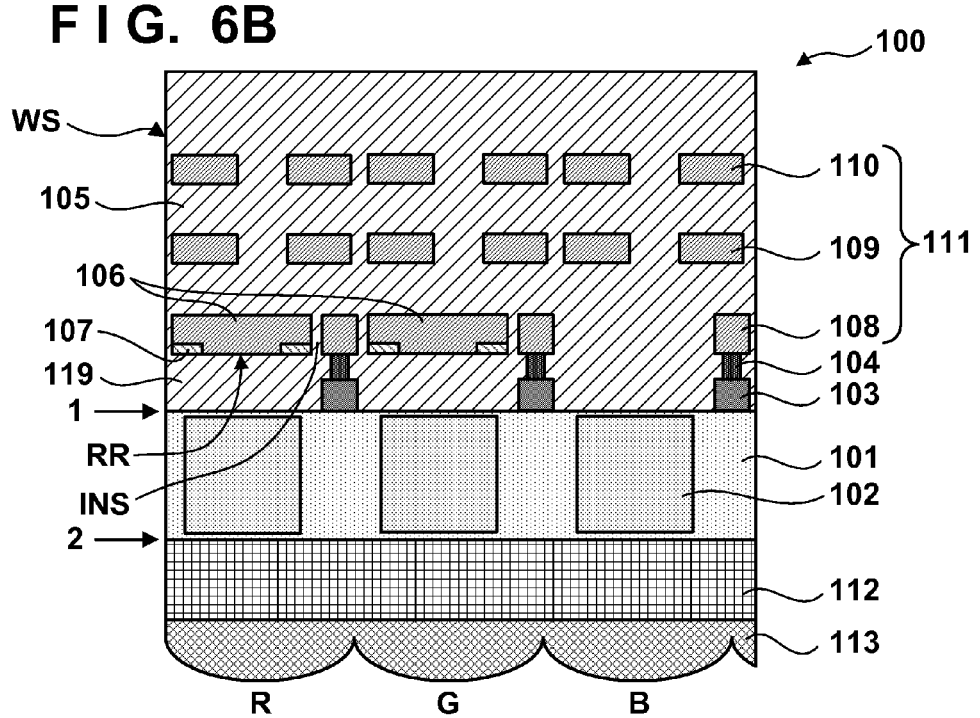

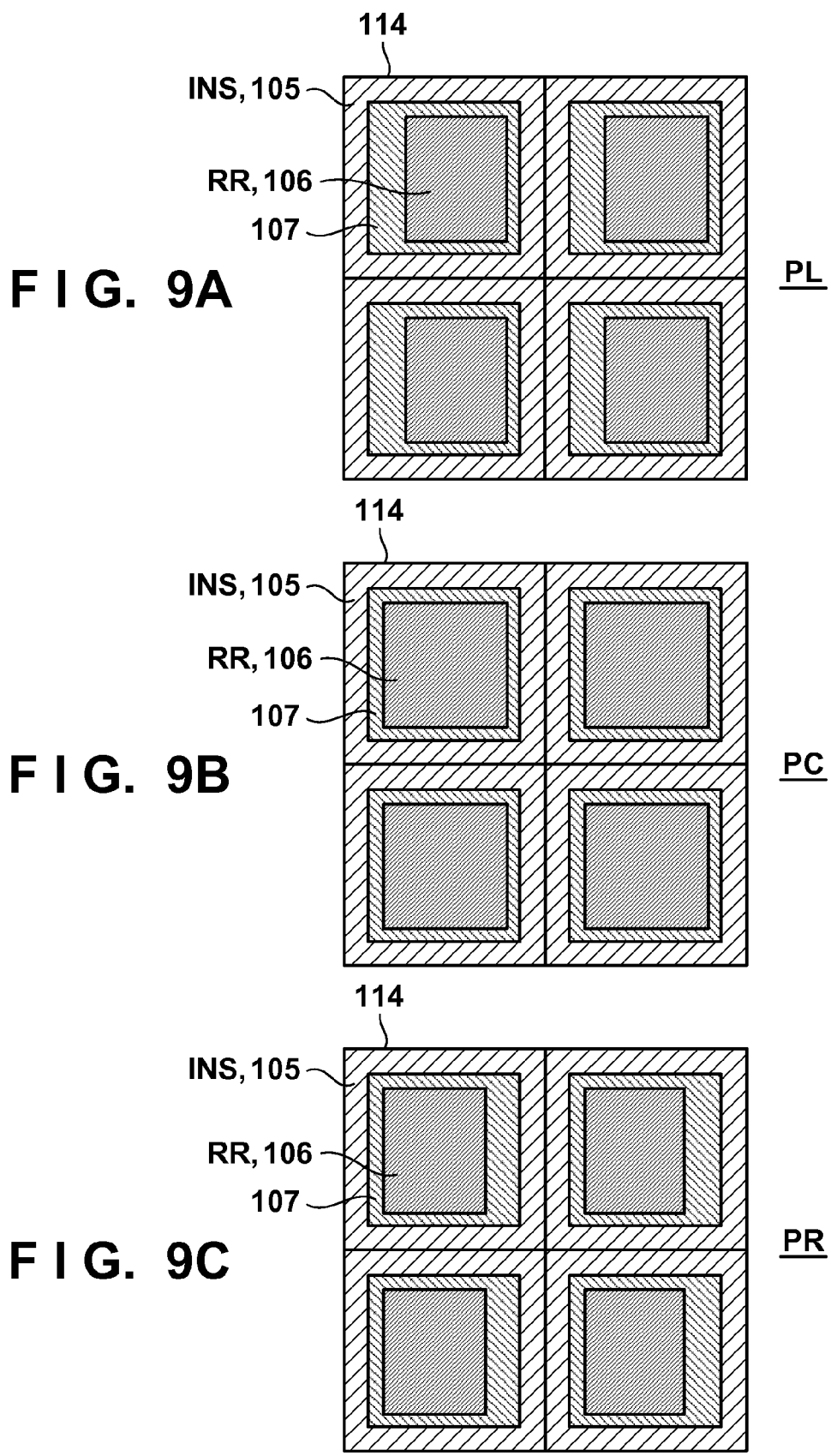

SOLID-STATE IMAGE SENSOR, METHOD OF MANUFACTURING THE SAME AND CAMERA

BACKGROUND OF THE INVENTION

1. Field of the Invention

The present invention relates to a solid-state image sensor, a method of manufacturing the same, and a camera.

2. Description of the Related Art

It has been required to improve the sensitivity of a solid-state image sensor used in a digital video camera, digital still camera, and the like. Japanese Patent Laid-Open No. 2011-151420 discloses a so-called back-side illumination solid-state image sensor. In the back-side illumination solid-state image sensor, if a semiconductor layer has a thickness of, for example, several μm or smaller, long-wavelength components of incident light having passed through a microlens pass through the semiconductor layer without being sufficiently absorbed. According to Japanese Patent Laid-Open No. 2011-151420, a reflection layer for returning, to the semiconductor layer, light having passed through the semiconductor layer is provided on the whole surface on the wiring layer side of the semiconductor layer. It is possible to improve the sensitivity by returning light having passed through the semiconductor layer to a photoelectric converter included in the semiconductor layer.

In the arrangement in which the reflection layer is provided on the whole surface on the wiring layer side of the semiconductor layer, however, color mixing may occur. More specifically, light which has passed through a first pixel and then obliquely entered a portion of the reflection layer between the first pixel and a second pixel adjacent to it may be reflected by that portion to enter the second pixel. In this case, light which should be detected in the first pixel is actually detected in the second pixel, thereby causing color mixing.

SUMMARY OF THE INVENTION

The present invention provides a technique advantageous in reducing color mixing.

The first aspect of the present invention provides a solid-state image sensor comprising: a semiconductor layer having a first face and a second face; and a wiring structure arranged on a side of the first face, wherein a plurality of photoelectric converters are arranged in the semiconductor layer, wherein light from an object is incident on the second face, wherein the wiring structure includes: a plurality of reflection portions arranged for at least some of the plurality of photoelectric converters, each of the plurality of reflection portions having a reflection region; a plurality of light absorbing portions each of which is arranged around the reflection region of corresponding one of the plurality of reflection portions; an insulator portion arranged to surround each of the plurality of light absorbing portions; and an interlayer insulating film arranged between the first face and a group of the plurality of reflection portions, the plurality of light absorbing portions, and the insulator portion, and wherein a reflectance of each of the plurality of light absorbing portions is smaller than a reflectance of the reflection region of corresponding one of the reflection portions, and a light transmittance of each of the plurality of light absorbing portions is smaller than a light transmittance of the insulator portion.

The second aspect of the present invention provides a method of manufacturing a slid-state image sensor which includes a semiconductor layer having a first face and a second face, and a wiring structure arranged on a side of the first face, wherein a plurality of photoelectric converters are arranged in the semiconductor layer, wherein light from an object is incident on the second face, wherein the wiring structure includes a plurality of reflection portions which are arranged for at least some of the plurality of photoelectric converters, each of the plurality of reflection portions having a reflection region, a plurality of light absorbing portions each of which is arranged around the reflection region of corresponding one of the plurality of reflection portions, an insulator portion which is arranged to surround each of the plurality of light absorbing portions, and an interlayer insulating film which is arranged between the first face and a group of the plurality of reflection portions, the plurality of light absorbing portions, and the insulator portion, and wherein a reflectance of each of the plurality of light absorbing portions is smaller than a reflectance of the reflection region of corresponding one of the reflection portions, and a light transmittance of each of the plurality of light absorbing portions is smaller than a light transmittance of the insulator portion, and the method comprising the steps of: forming the interlayer insulating film on the first face of the semiconductor layer, forming the plurality of light absorbing portions and the plurality of reflection portions on the interlayer insulating film, and forming the insulator portion to surround each of the plurality of light absorbing portions.

The third aspect of the present invention provides a camera comprising: the solid-state image sensor as specified as the first aspect of the present invention; and a processor which processes a signal output from the solid-state image sensor.

Further features of the present invention will become apparent from the following description of exemplary embodiments with reference to the attached drawings.

BRIEF DESCRIPTION OF THE DRAWINGS

FIGS. 6A and 6B are sectional views each schematically showing the sectional structure of a solid-state image sensor according to the third embodiment of the present invention;

FIGS. 9A to 9C are views for explaining the fourth embodiment of the present invention;

DESCRIPTION OF THE EMBODIMENTS

Figure 1:
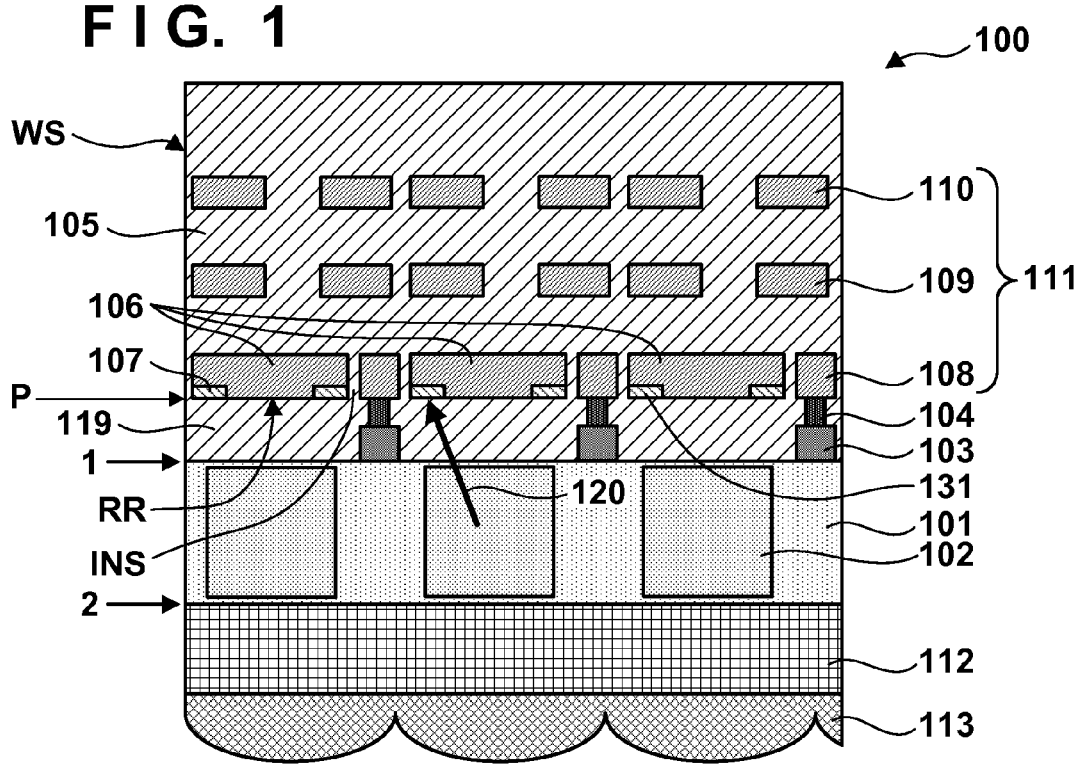
FIG. 1 is a sectional view schematically showing the sectional structure of a solid-state image sensor according to the first embodiment of the present invention.

FIG. 1 schematically shows the sectional structure of a solid-state image sensor 100 according to the first embodiment of the present invention. Note that FIG. 1 shows only three pixels but the solid-state image sensor 100 can include a larger number of pixels. The solid-state image sensor 100 can include a semiconductor layer 101 having a first face 1 and second face 2, a plurality of photoelectric converters 102 two-dimensionally arranged in the semiconductor layer 101, and a wiring structure WS arranged on the side of the first face 1. The solid-state image sensor 100 is configured so that light from an object is incident on the second face 2 through an imaging lens. That is, the solid-state image sensor 100 is formed as a back-side illumination solid-state image sensor in which a wiring structure is arranged on the side of the first face of a semiconductor layer and light from an object is incident on the second face of the semiconductor layer. A plurality of microlenses 113 can be typically arranged on the side of the second face 2. A planarizing layer 112 can be arranged between the second face 2 of the semiconductor layer 101 and the microlenses 113. Although not shown, a color filter layer can be arranged between the planarizing layer 112 and the microlenses 113.

The semiconductor layer 101 can be made of, for example, silicon. The plurality of photoelectric converters 102 are two-dimensionally arranged in the semiconductor layer 101. As an example, the semiconductor layer 101 can have a semiconductor region of a first conductivity type, and the photoelectric converter 102 can include a semiconductor region of a second conductivity type arranged within the semiconductor region of the first conductivity type. Note that the first and second conductivity types are opposite to each other. One pixel typically includes one photoelectric converter 102. Pixels or elements included in the pixels are electrically isolated from each other by an isolation portion. The isolation portion can include an insulator such as LOCOS (LOCal Oxidation of Silicon) or STI (Shallow Trench Isolation). Alternatively, the isolation portion may include an insulator extending through the semiconductor layer 101, such as DTI (Deep Trench Isolation). In the embodiment in which the insulator extending through the semiconductor layer 101 is used, the semiconductor layer 101 may be divided into a plurality of portions by the isolation portion. Since the insulator is generally transparent, obliquely incident light readily enters an adjacent pixel. In such embodiment, therefore, it is possible to obtain the effect of reducing color mixing.

A plurality of transistors are arranged on the first face 1 of the semiconductor layer 101. The source and drain of each transistor are formed in the semiconductor layer 101, and the gate of each transistor is arranged on the first face 1 of the semiconductor layer 101 via a gate insulating film. The plurality of transistors can include, for example, a transfer transistor which forms, in the semiconductor layer 101, a channel for transferring charges accumulated in the photoelectric converter 102 to a floating diffusion. The plurality of transistors can also include a reset transistor for resetting the potential of the floating diffusion and an amplification transistor for outputting a signal corresponding to the potential of the floating diffusion to a vertical signal line.

FIG. 1 shows a gate 103 of the transfer transistor as an example of the plurality of transistors. The gate 103 can be made of, for example, polysilicon. The wiring structure WS is arranged on the side of the first face 1 of the semiconductor layer 101. The wiring structure WS can include an interlayer insulating film 119 which covers the first face 1 of the semiconductor layer 101 and the gates 103, wiring layers 108, 109, and 110, and an interlayer insulating film 105. The wiring layers 108, 109, and 110 are arranged in the interlayer insulating film 105. The interlayer insulating films 119 and 105 may be made of the same material or different materials. In an example, the interlayer insulating films 119 and 105 can be silicon oxide films. The gate 103 is connected to the wiring pattern of the wiring layer 108 via a contact plug 104.

In the example shown in FIG. 1, the wiring layers 108, 109, and 110 form the three-layer wiring structure WS. However, the number of wiring layers in the wiring structure WS is not limited to three. In the example shown in FIG. 1, the wiring layer 108 of the lowest layer (first layer) includes a plurality of reflection portions 106. Each reflection portion 106 has a reflection region RR. Part of light having entered through the microlens 113, which has not been absorbed by the photoelectric converter 102 of the semiconductor layer 101 enters the reflection region RR of the reflection portion 106, is reflected by the reflection region RR to return to the photoelectric converter 102, and is photoelectrically converted by the photoelectric converter 102. In this way, it is possible to improve the sensitivity by providing the reflection portions 106 on the side of the first face 1 of the semiconductor layer 101.

Figure 13:
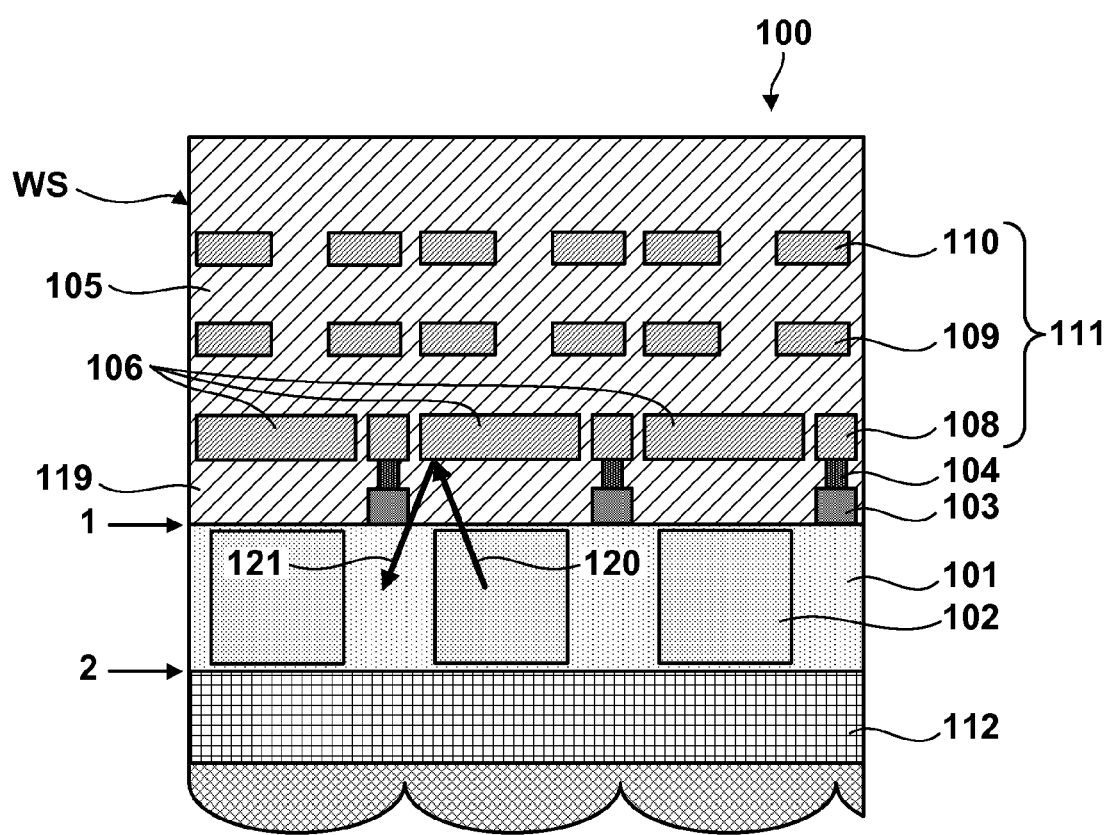
FIG. 13 is a view showing a comparative example.

In a comparative example shown in FIG. 13, light 120 having obliquely passed through the photoelectric converter 102 enters the outer portion of the reflection portion 106, and is reflected by it. Light 121 reflected by the outer portion can enter the photoelectric converter 102 adjacent to the photoelectric converter 102 through which the light 120 has passed. This may cause color mixing.

In the first embodiment, as shown in FIG. 1, a plurality of light absorbing portions 107 respectively arranged around the reflection regions RR of the plurality of reflection portions 106 are provided in the wiring structure WS. Each light absorbing portion 107 can be arranged to surround the reflection region RR of the corresponding one of the plurality of reflection portions 106. Furthermore, an insulator portion INS is arranged to surround each of the plurality of light absorbing portions. The insulator portion INS can typically be part of the interlayer insulating film 105. Each light absorbing portion 107 can be made of, for example, an electrical conducting material. The interlayer insulating film 119 is arranged between the first face 1 of the semiconductor layer 101 and the plurality of reflection portions 106, the plurality of light absorbing portions 107, and the insulator portion INS.

The reflection regions RR of the reflection portions 106 and light incident surfaces 131 of the light absorbing portions 107 can be arranged on one virtual plane P. Each light incident surface 131 is one of the two surfaces of the corresponding light absorbing portion 107, which faces the first face 1 of the semiconductor layer 101 via the interlayer insulating film 119. The light absorbing portion 107 and reflection portion 106 can be arranged so that their outer edges coincide with each other. Note that the light absorbing portion 107 may absorb all light incident on it. Alternatively, the light absorbing portion 107 may absorb only part of light, which has reached there. Part of light, which has reached the light incident surface 131 of the light absorbing portion 107 from the side of the semiconductor layer 101, may be reflected by the interface between the light absorbing portion 107 and the interlayer insulating film 119, that is, the light incident surface 131. Alternatively, light which has not been absorbed by the light absorbing portion 107 can be reflected by the surface on the opposite side of the light incident surface 131, that is, the interface between the light absorbing portion 107 and the reflection portion 106, returned to the light absorbing portion 107, and then absorbed by it.

The reflectance of each of the plurality of light absorbing portions 107 is smaller than that of the reflection region RR of each of the plurality of reflection portions 106. The light transmittance of each of the plurality of light absorbing portions 107 is smaller than that of the insulator portion INS. Decreasing the reflectance of the light absorbing portion 107 contributes to reducing color mixing. In terms of reduction of color mixing, therefore, the reflectance of the light absorbing portion 107 can be made as small as possible. Furthermore, decreasing the light transmittance of the light absorbing portion 107, that is, increasing the light absorbing amount by the light absorbing portion 107 contributes to reducing color mixing. In terms of reduction of color mixing, therefore, the light transmittance of the light absorbing portion 107 can be made as small as possible.

Figure 2:
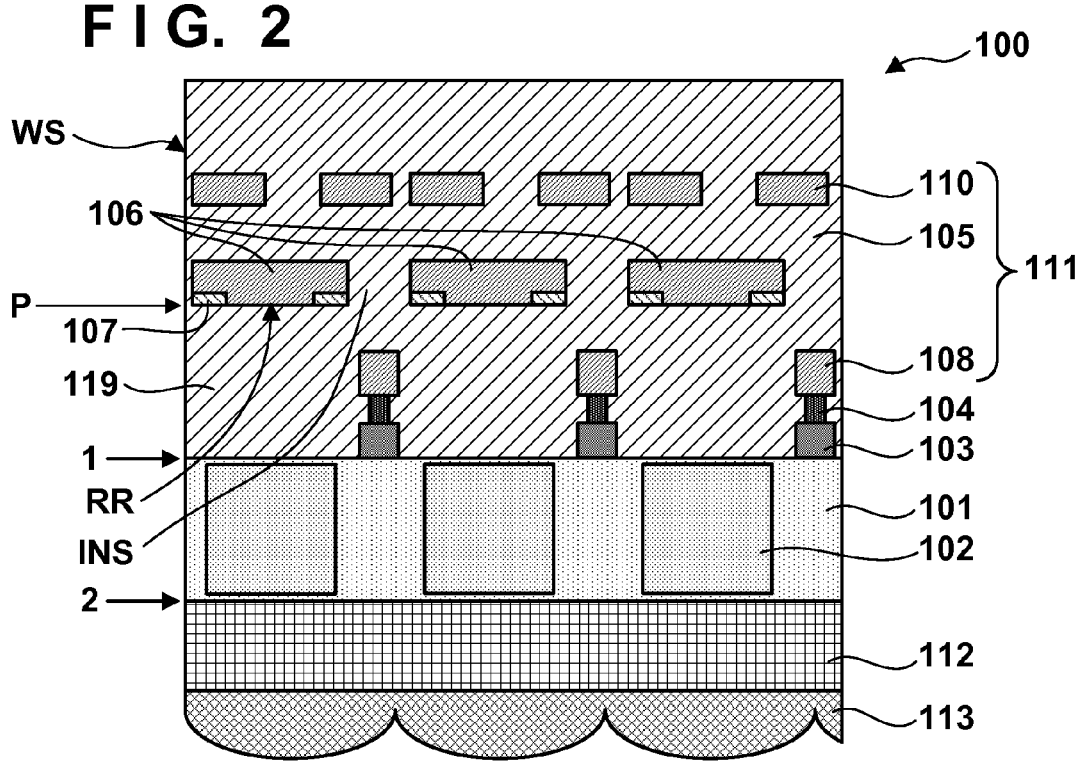
FIG. 2 is a sectional view schematically showing the sectional structure of the solid-state image sensor according to the first embodiment of the present invention.

In the example shown in FIG. 1, the reflection portions 106 are arranged in the wiring layer 108 of the lowest layer, that is, the first layer. However, as shown in FIG. 2, the reflection portions 106 may be arranged in another wiring layer, for example, the wiring layer 109 which is the wiring layer of the second layer. Alternatively, the reflection portions 106 may be arranged in the wiring layer 110 which is the wiring layer of the third layer.

Figure 3:
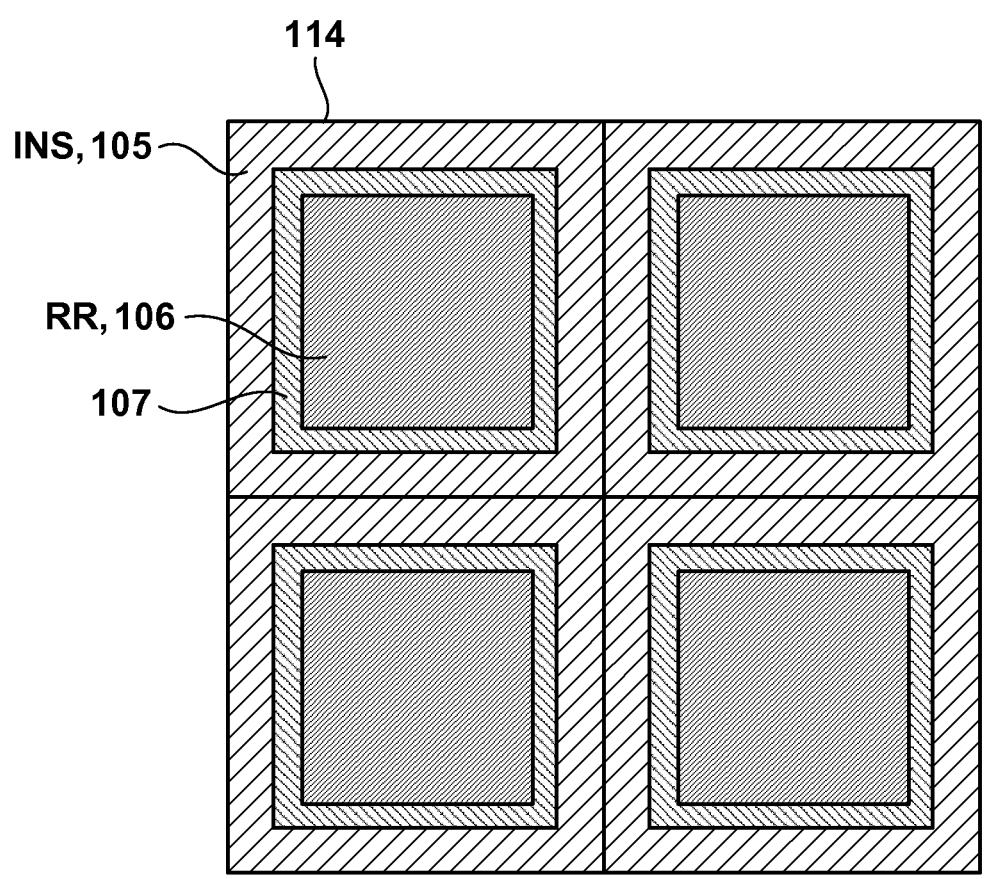
FIG. 3 is a sectional view showing a wiring structure taken along a virtual plane P shown in FIG. 1.

FIG. 3 exemplifies the wiring structure WS taken along the virtual plane P shown in FIG. 2. The light absorbing portion 107 is arranged around the corresponding reflection region RR. Therefore, the reflection region RR is arranged in a region between the light absorbing portion 107 and the center of the reflection portion 106 on the virtual plane P. Referring to FIG. 3, the light absorbing portion 107 is arranged to surround the reflection region RR of the reflection portion 106, and the insulator portion INS is arranged to surround the light absorbing portion 107. In FIG. 3, a rectangular 114 schematically shows the region of one pixel. Note that in FIG. 3, the light absorbing portion 107 is arranged on the entire perimeter of the reflection region RR. However, the light absorbing portion 107 may be arranged to only partially surround the reflection region RR. For example, it is sometimes desirable to adjust the color mixing ratio with an adjacent pixel in a different direction. In such a case, the light absorbing portion 107 may be arranged in a portion near a pixel where it is preferable to reduce color mixing, and it may be omitted in the remaining portion. Alternatively, the light absorbing portion 107 may be intermittently arranged. A portion of the surface of the reflection portion 106 on the side of the semiconductor layer 101, where the light absorbing portion 107 is not arranged, may be part of the reflection region RR.

The light absorbing portion 107 may be provided under the wiring pattern of a wiring layer 111 for communicating an electric signal, in addition to the reflection portion 106 which communicates no electric signal. As exemplified in FIG. 4, for example, the light absorbing portion 107 may be provided under a wiring pattern arranged on the wiring layer 108.

Figure 4:
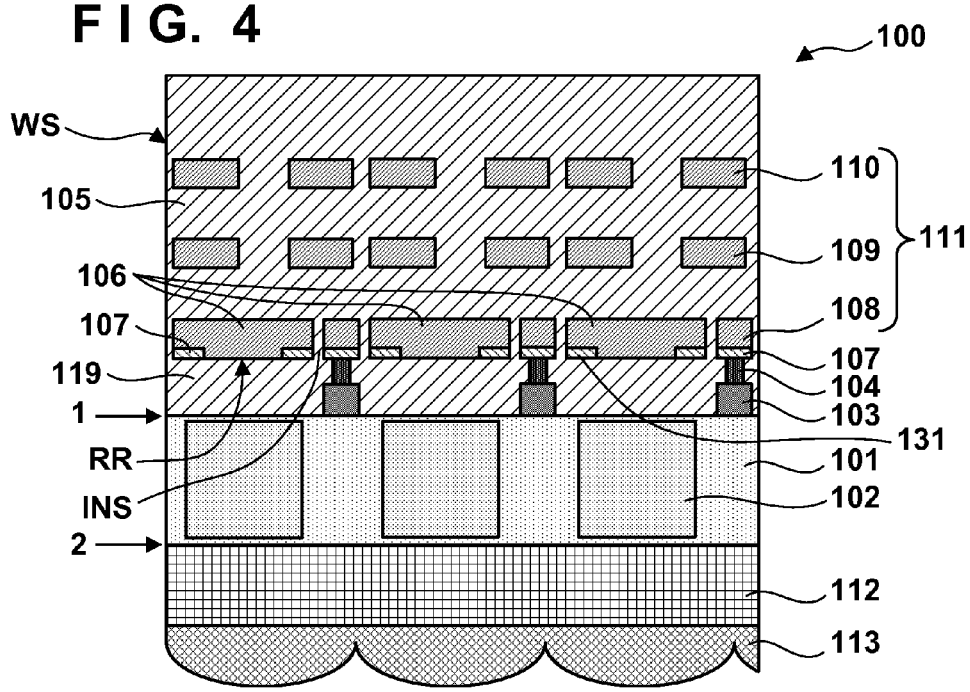
FIG. 4 is a sectional view schematically showing the sectional structure of the solid-state image sensor according to the first embodiment of the present invention.

A method of manufacturing the solid-state image sensor 100 shown in FIG. 4 will be described below with reference to FIGS. 12A to 12E. In a process shown in FIG. 12A, a p-type well region (not shown) is formed by implanting boron into an n-type semiconductor layer 101. Furthermore, photoelectric converters 102 are formed by implanting phosphorus into the well region. After that, an oxide film (not shown) is formed on a first face 1 of the semiconductor layer 101, and a polysilicon film is formed on the oxide film. Gates 103 of transfer transistors, and the gates of reset transistors and amplification transistors (non are shown) are formed by patterning the polysilicon film.

An interlayer insulating film 119 is formed on the first face 1 of the semiconductor layer 101 to cover the first face 1 and gates, and then the surface of the interlayer insulating film 119 is planarized. The interlayer insulating film 119 is preferably made of, for example, a material having transparency for visible light or infrared light. The interlayer insulating film 119 can be made of (a) silicon oxide, (b) silicon oxide doped with phosphorus, boron, nitrogen, fluorine, or the like, (c) silicon nitride, or (d) an acrylic resin.

Contact holes are formed to extend through the interlayer insulating film 119. An electrical conducting material film is formed in the contact holes and on the interlayer insulating film 119. The electrical conducting material film is polished, thereby forming contact plugs 104.

Figure 12A:
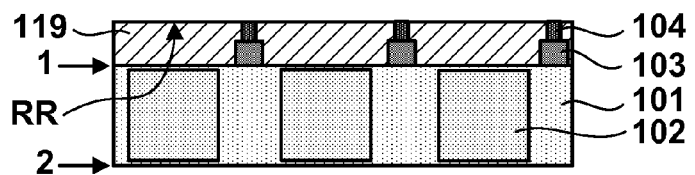
FIGS. 12A to 12E are views exemplifying a method of manufacturing the solid-state image sensor according to the first embodiment of the present invention.
Figure 12B:
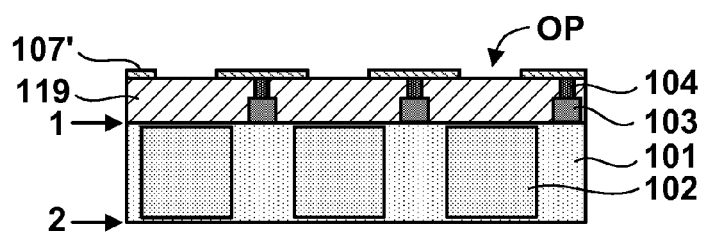

In a process shown in FIG. 12B, a light absorbing material film is formed to cover the interlayer insulating film 119, and then patterned, thereby forming a light absorbing material pattern 107'. The light absorbing material pattern 107' has openings OP in regions in each of which a reflection region RR should be formed. Note that the light absorbing material film (light absorbing material pattern 107') is a film (pattern) for forming light absorbing portions 107, and its reflectance is smaller than that of the reflection region RR of each reflection portion 106 and its transmittance is smaller than that of an insulator portion INS. The light absorbing material film (light absorbing material pattern 107') can be made of, for example, an electrical conducting material such as titanium nitride (TiN) or silicon carbide (SiC). The light absorbing material film (light absorbing material pattern 107') may be formed from, for example, a multilayered film consisting of a titanium nitride (TiN) film and silicon carbide (SiC) film. The light absorbing material film may be made of a material used for a barrier metal.

Figure 12C:
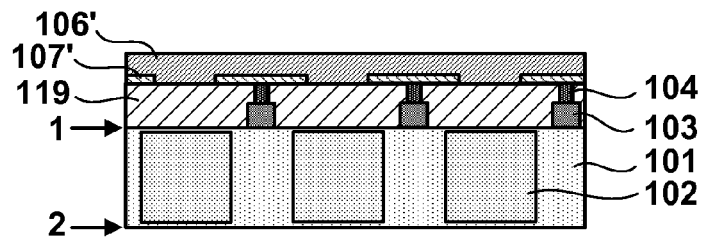

In a process shown in FIG. 12C, a reflective material film 106' is formed to cover the interlayer insulating film 119 and light absorbing material pattern 107'. Note that the reflective material film 106' can be considered as a film for forming a wiring layer 108 including a plurality of reflection portions 106, that is, a wiring material film.

The reflective material film 106' can be made of an electrical conducting material. The electrical conducting material is preferable as a material having an appropriate reflectance and conductivity. The reflective material film 106' can contain aluminum, copper, gold, tungsten, titanium, or tantalum as a main component. If a material having a large diffusion coefficient such as copper is used for the reflective material film 106', it is preferable to stack a diffusion preventing film to cover the reflective material film 106'. For the diffusion preventing film, for example, silicon nitride or silicon carbide can be used. The reflection portions 106 and a portion of the wiring layer 108 other than the reflection portions 106 may be formed using different materials in different processes. In this case, the reflection portions 106 may be made of a material having low conductivity, and the portion of the wiring layer 108 other than the reflection portions 106 may be made of a material having low reflectance.

Figure 12D:
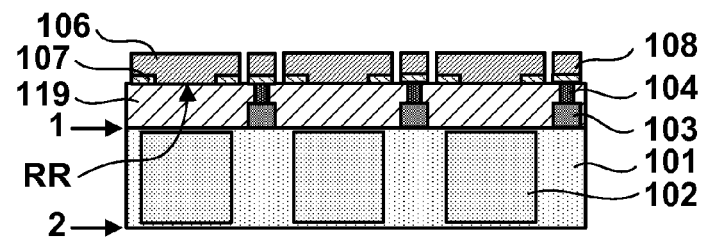

In a process shown in FIG. 12D, the reflective material film 106' is patterned by etching so that a plurality of reflection portions 106 are formed. Furthermore, a portion of the light absorbing material pattern 107' which is exposed by etching the reflective material film 106' is etched. With this process, a plurality of reflection portions 106 and a plurality of light absorbing portions 107 are formed.

Figure 12E:
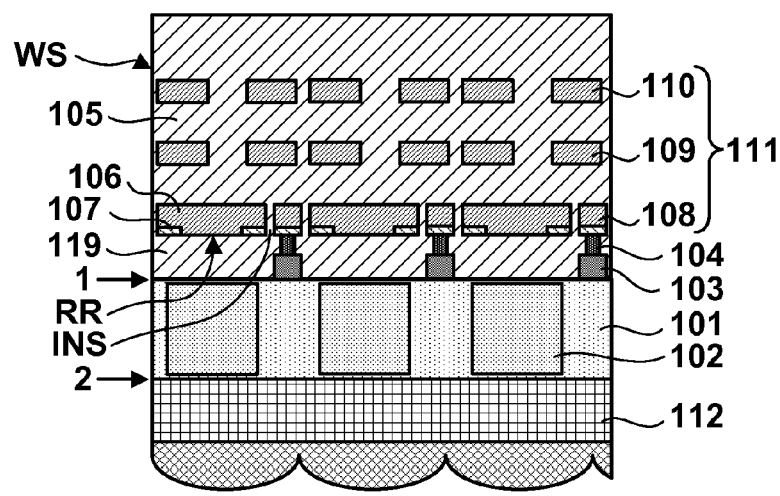

In a process shown in FIG. 12E, an interlayer insulating film 105 is formed to cover the interlayer insulating film 119 and the plurality of reflection portions 106, and then planarized, thereby forming a wiring layer 109 on it. Similarly, an interlayer insulating film 105 is formed to cover the wiring layer 109, and then planarized, thereby forming a wiring layer 110 on it. In this way, a wiring structure WS is formed. The interlayer insulating film 105 can be, for example, a silicon oxide film.

After that, a support substrate (not shown) may be bonded to the surface side of the wiring structure WS. The support substrate is useful to improve the mechanical strength. For example, a silicon substrate or the like can be used as the support substrate.

A second face 2 of the semiconductor layer 101 is polished and planarized. On the side of the second face 2, a planarizing layer 112, a color filter (not shown), and microlenses 113 can be formed, as needed.

Figure 5:
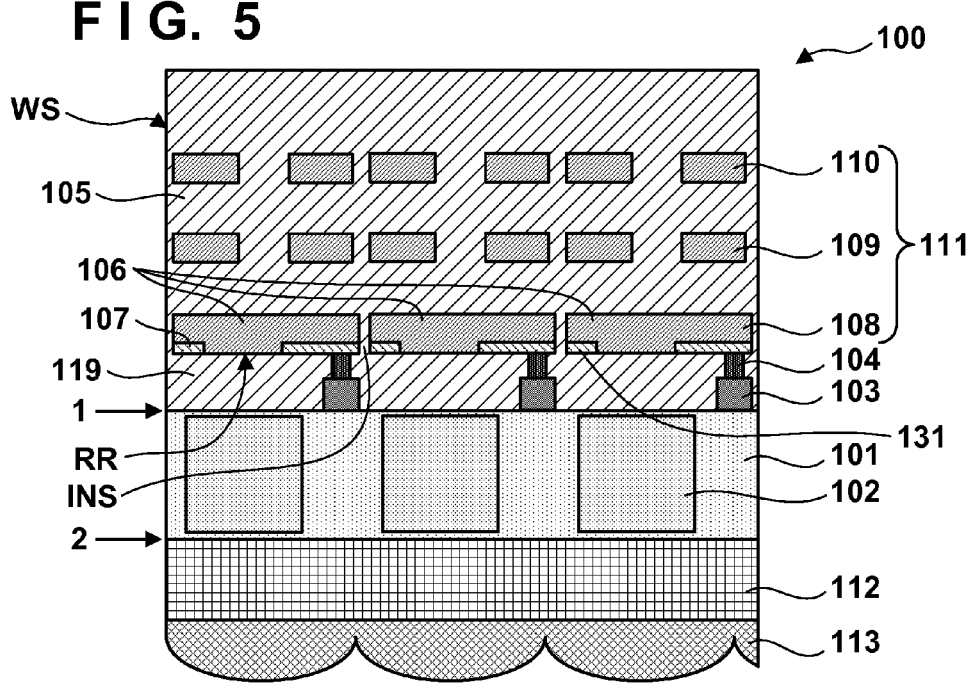
FIG. 5 is a sectional view schematically showing the sectional structure of a solid-state image sensor according to the second embodiment of the present invention.

A solid-state image sensor 100 according to the second embodiment of the present invention will be described below with reference to FIG. 5. Note that points not mentioned in the second embodiment can comply with the first embodiment. In the second embodiment, a plurality of reflection portions 106 are formed as part of a wiring pattern for communicating an electric signal. For example, each reflection portion 106 can be formed as part of a wiring pattern connected to a gate 103, source, or drain of a transfer transistor. Alternatively, each reflection portion 106 can be formed as part of a wiring pattern connected to the gate, source, or drain of a reset transistor or amplification transistor. Or, each reflection portion 106 can be formed as part of a vertical signal line to which a signal is output from a pixel. Or, each reflection portion 106 can be formed as part of a wiring pattern for supplying a reference ground voltage to a pixel.

In the second embodiment, it is possible to improve the degree of freedom of wiring by forming each reflection portion 106 as part of a wiring pattern for communicating an electric signal. Each reflection portion 106 may be formed as part of a wiring pattern for communicating an electric signal in a wiring layer other than a wiring layer 108 of a first layer, for example, a wiring layer 109 of a second layer or a wiring layer 110 of a third layer.

A solid-state image sensor 100 according to the third embodiment of the present invention will be described below with reference to FIGS. 6A and 6B. Note that points not mentioned in the third embodiment can comply with at least one of the first and second embodiments.

A plurality of photoelectric converters 102 include a first photoelectric converter 102 on which light of a first wavelength range is incident, a second photoelectric converter 102 on which light of a second wavelength range is incident, and a third photoelectric converter 102 on which light of a third wavelength range is incident. Note that a wavelength within the second wavelength range is shorter than that within the first wavelength range, and a wavelength within the third wavelength range is shorter than that within the second wavelength range. More specifically, the first wavelength range can be a red (R) wavelength range, the second wavelength range can be a green (G) wavelength range, and the third wavelength range can be a blue (B) wavelength range. Referring to FIGS. 6A and 6B, reference symbols R, G, and B denote pixels for detecting light of the red (R) wavelength range, light of the green (G) wavelength range, and light of the blue (B) wavelength range, respectively.

In the third embodiment, a plurality of reflection portions 106 are arranged for only the first photoelectric converter (R) or only the first photoelectric converter (R) and third photoelectric converter (G). That is, in the third embodiment, the reflection portions 106 are respectively provided for some of the plurality of photoelectric converters 102. Note that in the first embodiment, the reflection portions 106 are respectively provided for all of the plurality of photoelectric converters 102. From the first and third embodiments, it is apparent that the reflection portions 106 need only be provided for at least some of the plurality of photoelectric converters 102.

The ratio at which light incident on a second face 2 of a semiconductor layer 101 is absorbed by the semiconductor layer 101 until it reaches a first face 1 becomes smaller as the wavelength of the light is longer. That is, the ratios of light beams which reach the first face 1 are larger in the order of a red (R) pixel, green (G) pixel, and blue (B) pixel. That is, the effect of improving the sensitivity and reducing color mixing by providing the reflection portions 106 and light absorbing portions 107 is largest in a red (R) pixel. As shown in FIG. 6A, therefore, the reflection portion 106 and light absorbing portion 107 may be provided in only a red (R) pixel. Alternatively, as shown in FIG. 6B, the reflection portions 106 and light absorbing portions 107 may be provided in only a red (R) pixel and green (g) pixel.

The third embodiment is useful when the layouts of a plurality of pixels are different from each other, and it is difficult to provide reflection portions 106 and light absorbing portions 107 in all the pixels, for example, when a plurality of photoelectric converters 102 share a floating diffusion.

A solid-state image sensor 100 according to the fourth embodiment of the present invention will be described below with reference to FIGS. 7 to 11B. Note that points not mentioned in the fourth embodiment can comply with at least one of the first to third embodiments. In the solid-state image sensor 100 according to the fourth embodiment, the relative position between a photoelectric converter 102 and a corresponding reflection region RR and light absorbing portion 107 is determined depending on the position of the photoelectric converter 102 in a semiconductor layer 101.

When the position of the photoelectric converter 102 in the semiconductor layer 101 changes, the direction of light which passes through a first face 1 of the semiconductor layer 101 also changes. It is preferable to change the shape of the reflection region RR and light absorbing portions 107 corresponding to the photoelectric converter 102 in accordance with the position of the photoelectric converter 102 in the semiconductor layer 101. This can be done so that sensitivity and color mixing nonuniformities over the whole imaging region formed by the array of a plurality of photoelectric converters 102 fall within tolerance ranges, respectively.

Figure 7:
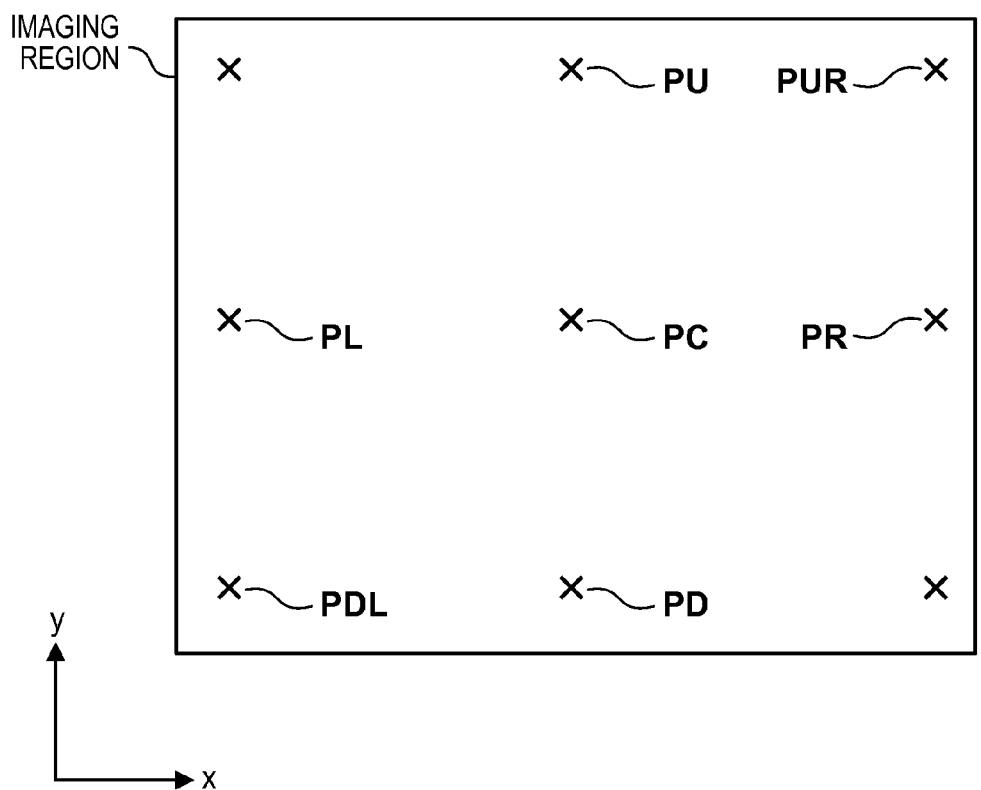
FIG. 7 is a view for explaining the fourth embodiment of the present invention.
Figure 8A:
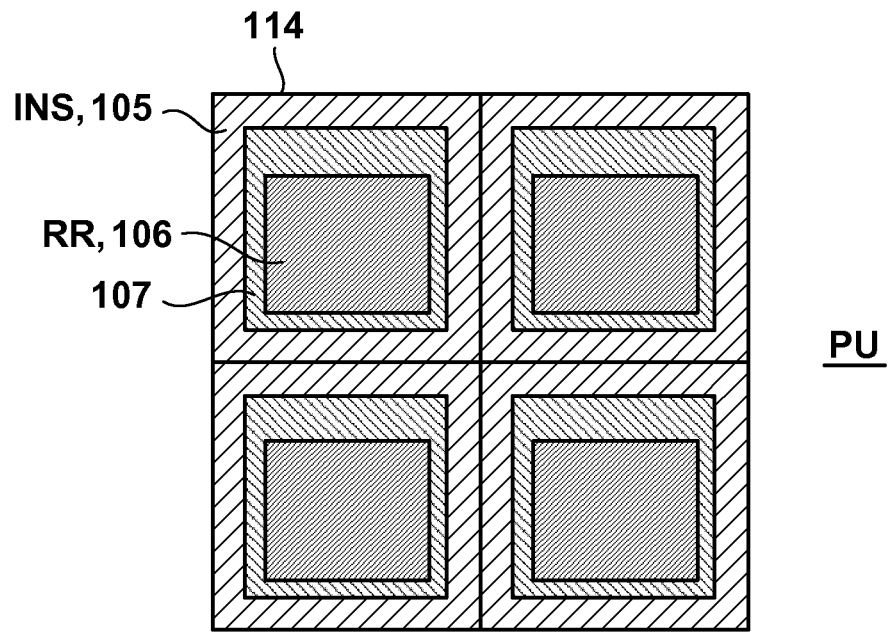
FIGS. 8A and 8B are views for explaining the fourth embodiment of the present invention.
Figure 8B:
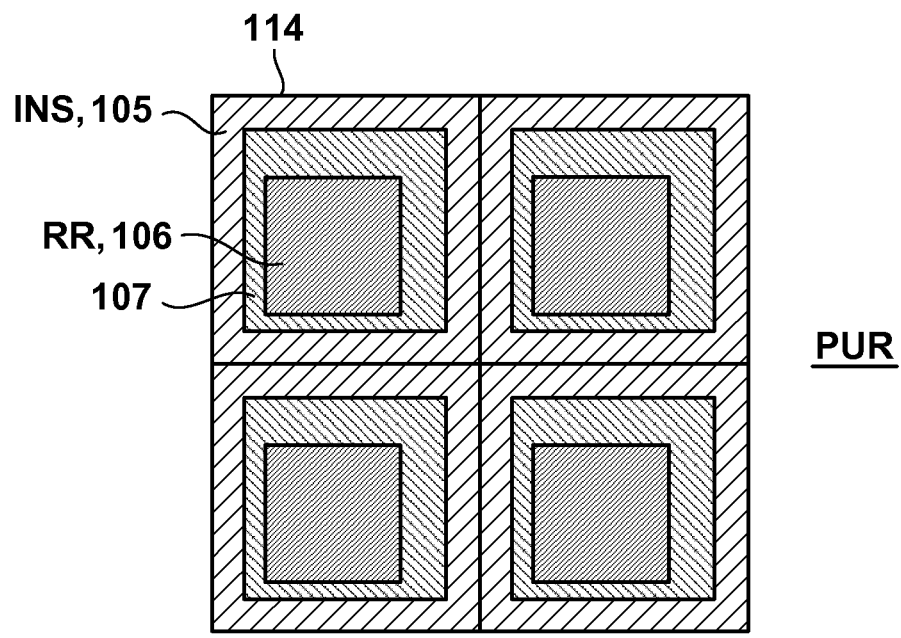
Figure 10A:
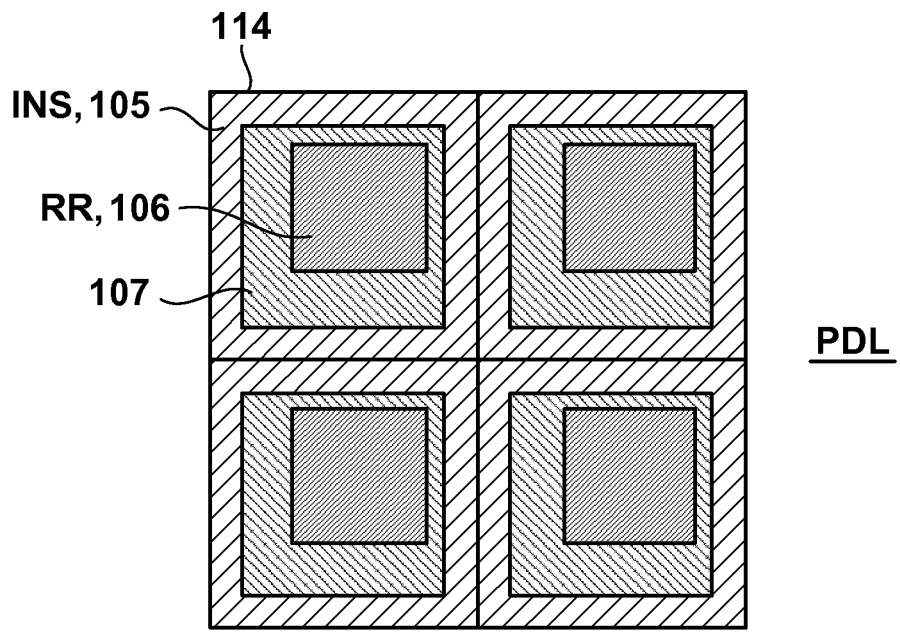
FIGS. 10A and 10B are views for explaining the fourth embodiment of the present invention.
Figure 10B:
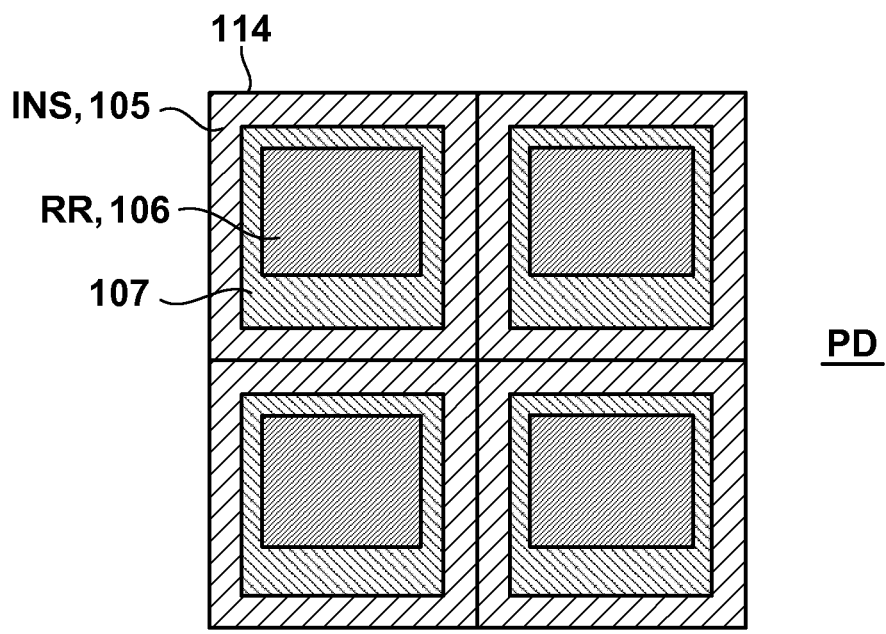
Figure 11A:
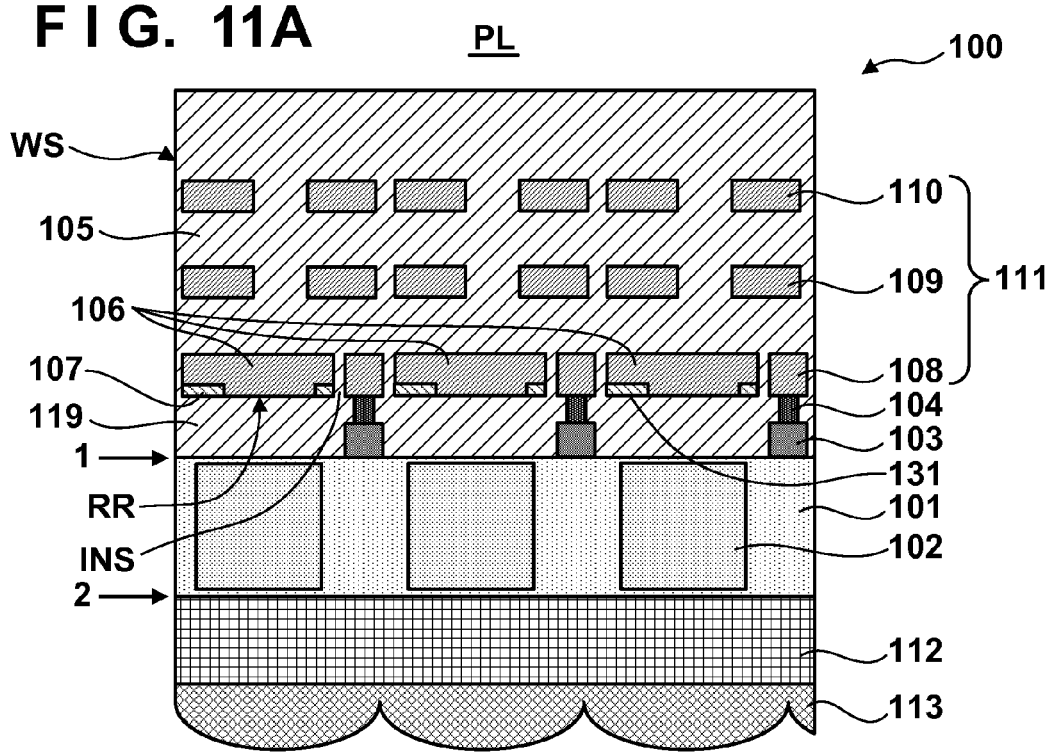
FIGS. 11A and 11B are views for explaining the fourth embodiment of the present invention.
Figure 11B:
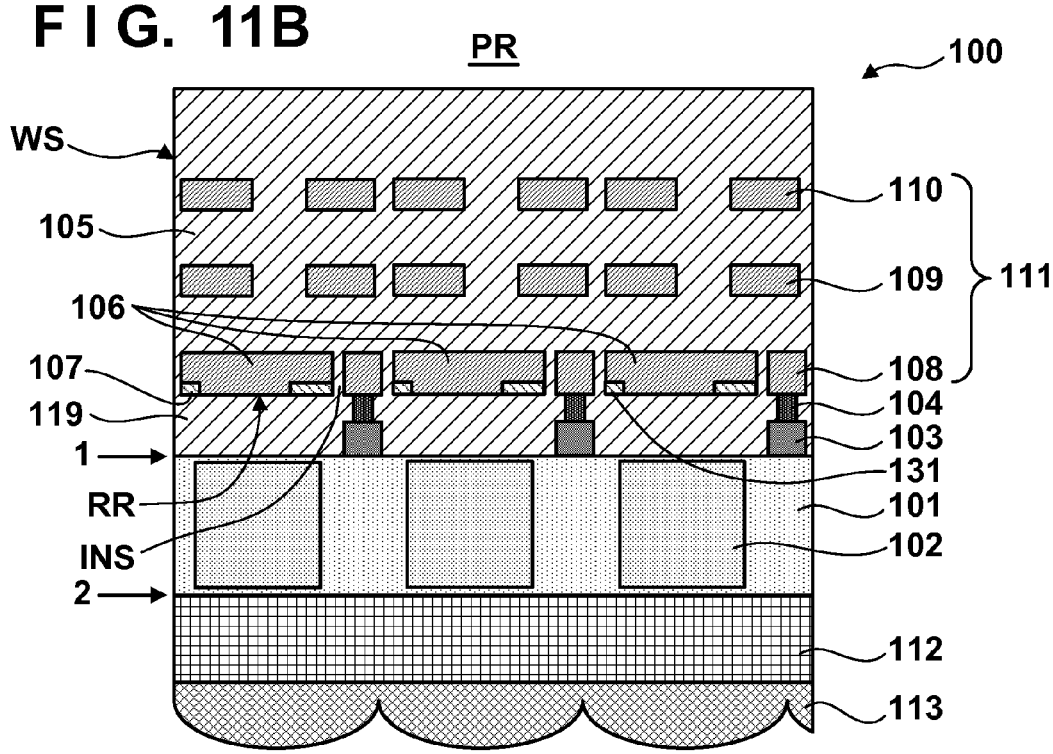

The fourth embodiment will be explained below based on a practical example with reference to FIGS. 7 to 11B. FIG. 7 shows the imaging region formed by the array of the plurality of photoelectric converters 102. Referring to FIG. 7, reference symbols PU, PUR, PL, PC, PR, PDL, and PD denote the positions of the photoelectric converters 102 (pixels) in the imaging region. Each of FIGS. 8A and 8B schematically shows reflection regions RR (reflection portions 106), light absorbing portions 107, and an insulator portion INS (interlayer insulating film 105) of four pixels arranged at each of the positions PU and PUR shown in FIG. 7. Each of FIGS. 9A to 9C schematically shows reflection regions RR (reflection portions 106), light absorbing portions 107, and an insulator portion INS (interlayer insulating film 105) of four pixels arranged at each of the positions PL, PC, and PR shown in FIG. 7. Each of FIGS. 10A and 10B schematically shows reflection regions RR (reflection portions 106), light absorbing portions 107, and an insulator portion INS (interlayer insulating film 105) of four pixels arranged at each of the positions PDL and PD shown in FIG. 7. Each of FIGS. 11A and 11B is a sectional view showing pixels arranged at each of the positions PL and PR shown in FIG. 7 taken along a cut surface parallel to the x direction.

In a pixel 114 arranged in the outer portion of a pixel region, the width of the light absorbing portion 107 is larger on the outer edge side of the pixel region than on the center side of the pixel region. Accordingly, the shape of the reflection region RR changes. In a portion on the center side of the pixel region, the light absorbing portion 107 may be omitted and the edge of the reflection region RR may coincide with the boundary of an insulator layer.

As an application of the solid-state image sensor according to each of the aforementioned embodiments, a camera incorporating the solid-state image sensor will be exemplarily described below. The camera conceptually includes not only a device whose principal purpose is photographing but also a device (for example, a personal computer or portable terminal) additionally provided with a photographing function. The camera includes the solid-state image sensor according to the present invention, which has been exemplified in the above embodiments, and a processing unit for processing a signal output from the solid-state image sensor. The processing unit can include, for example, an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-248709, filed Nov. 12, 2012, which is hereby incorporated by reference herein in its entirety.

What is claimed is:

1. A solid-state image sensor comprising:
   a semiconductor layer having a first face and a second face; and
   a wiring structure arranged on a side of the first face,
   wherein a plurality of photoelectric converters are arranged in the semiconductor layer,
   wherein light from an object is incident on the second face, wherein the wiring structure includes:
   a plurality of reflection portions arranged for at least some of the plurality of photoelectric converters, each of the plurality of reflection portions having a reflection region;
   a plurality of light absorbing portions each of which is arranged around the reflection region of corresponding one of the plurality of reflection portions;
   an insulator portion arranged to surround each of the plurality of light absorbing portions; and
   an interlayer insulating film arranged between the first face and a group of the plurality of reflection portions, the plurality of light absorbing portions, and the insulator portion, and
   wherein a reflectance of each of the plurality of light absorbing portions is smaller than a reflectance of the reflection region of corresponding one of the reflection portions, and a light transmittance of each of the plurality of light absorbing portions is smaller than a light transmittance of the insulator portion.

2. The sensor according to claim 1, wherein the light absorbing portion is made of an electrical conducting material.

3. The sensor according to claim 1, wherein the light absorbing portion has a light incident surface facing toward the first face via the interlayer insulating film, and a surface on an opposite side of the light incident surface, and wherein the reflection portion includes a portion covering the surface on the opposite side.

4. The sensor according to claim 3, wherein an outer edge of the light absorbing portion coincides with an outer edge of the reflection portion.

5. The sensor according to claim 1, wherein the plurality of reflection portions are formed as part of a wiring pattern for communicating an electric signal.

6. The sensor according to claim 1, wherein the plurality of photoelectric converters include a first photoelectric converter on which light of a first wavelength range is incident, a second photoelectric converter on which light with a wavelength within a second wavelength range, that is shorter than the first wavelength range, is incident, and a third photoelectric converter on which light with a wavelength within a third wavelength range, that is shorter than the second wavelength range, is incident, and
   wherein the plurality of reflection portions and the plurality of light absorbing portions are provided for only the first photoelectric converter or only the first photoelectric converter and the second photoelectric converter.

7. The sensor according to claim 1, wherein a shape of the reflection portion and the light absorbing portion corresponding to the photoelectric converter is determined in accordance with a position of the photoelectric converter in the semiconductor layer.

8. The sensor according to claim 1, wherein each of the plurality of light absorbing portions is arranged to surround the reflection region of a corresponding one of the plurality of reflection portions.

9. A method of manufacturing a slid-state image sensor which includes a semiconductor layer having a first face and a second face, and a wiring structure arranged on a side of the first face,
   wherein a plurality of photoelectric converters are arranged in the semiconductor layer,
   wherein light from an object is incident on the second face, wherein the wiring structure includes a plurality of reflection portions which are arranged for at least some of the plurality of photoelectric converters, each of the plurality of reflection portions having a reflection region, a plurality of light absorbing portions each of which is arranged around the reflection region of corresponding one of the plurality of reflection portions, an insulator portion which is arranged to surround each of the plurality of light absorbing portions, and an interlayer insulating film which is arranged between the first face and a group of the plurality of reflection portions, the plurality of light absorbing portions, and the insulator portion, and
   wherein a reflectance of each of the plurality of light absorbing portions is smaller than a reflectance of the reflection region of corresponding one of the reflection portions, and a light transmittance of each of the plurality of light absorbing portions is smaller than a light transmittance of the insulator portion, and
   the method comprising the steps of:
   forming the interlayer insulating film on the first face of the semiconductor layer,
   forming the plurality of light absorbing portions and the plurality of reflection portions on the interlayer insulating film, and
   forming the insulator portion to surround each of the plurality of light absorbing portions.

10. The method according to claim 9, wherein
the step of forming the plurality of light absorbing portions and the plurality of reflection portions includes the steps of
forming, on the interlayer insulating film, a light absorbing material pattern including a prospective part of the plurality of light absorbing portions and having openings in a prospective region of the reflection regions,
forming a reflective material film to cover the interlayer insulating film and the light absorbing material pattern,
patterning the reflective material film by etching so that the plurality of reflection portions are formed, and
etching a portion of the light absorbing material pattern, which is exposed by etching the reflective material film.

11. A camera comprising:
a solid-state image sensor according to claim 1; and
a processor which processes a signal output from the solid-state image sensor.

\* \* \* \* \*